United States Patent [19]

So

[11] Patent Number: 5,883,844
[45] Date of Patent: Mar. 16, 1999

[54] METHOD OF STRESS TESTING INTEGRATED CIRCUIT HAVING MEMORY AND INTEGRATED CIRCUIT HAVING STRESS TESTER FOR MEMORY THEREOF

[75] Inventor: Jason Siucheong So, Carrollton, Tex.

[73] Assignee: STMicroelectronics, Inc., Carrollton, Tex.

[21] Appl. No.: 862,969

[22] Filed: May 23, 1997

[51] Int. Cl.⁶ ..................................................... G11C 7/00
[52] U.S. Cl. ..................................... 365/201; 365/230.03
[58] Field of Search ............................. 365/201, 230.03; 371/21.1, 21.2, 21.3, 20.4

[56] References Cited

U.S. PATENT DOCUMENTS

| | | | |
|---|---|---|---|
| 4,267,583 | 5/1981 | Suzuki | 365/201 |
| 4,487,705 | 12/1984 | Recchuite | 252/46.6 |
| 4,553,225 | 11/1985 | Ohe | 365/201 |
| 4,560,959 | 12/1985 | Rokos et al. | 331/176 |
| 4,701,886 | 10/1987 | Sakakibara et al. | 365/230.03 |
| 4,715,034 | 12/1987 | Jacobson | 371/21 |
| 4,744,061 | 5/1988 | Takemae et al. | 365/201 |
| 4,855,688 | 8/1989 | Douziech et al. | |
| 4,858,190 | 8/1989 | Yamaguchi et al. | 365/189.05 |
| 4,871,963 | 10/1989 | Cozzi | |
| 4,879,688 | 11/1989 | Turner et al. | 365/201 |
| 4,882,702 | 11/1989 | Struger et al. | 364/900 |
| 4,916,700 | 4/1990 | Ito et al. | 371/21.1 |
| 4,918,378 | 4/1990 | Katircioglu et al. | 365/201 |
| 4,969,121 | 11/1990 | Chan et al. | 364/900 |
| 5,006,787 | 4/1991 | Katircioglu et al. | 324/73.1 |
| 5,034,923 | 7/1991 | Kuo et al. | 365/189.01 |
| 5,138,619 | 8/1992 | Fasang et al. | 371/21.1 |
| 5,173,906 | 12/1992 | Dreibelbis et al. | 371/22.5 |
| 5,185,722 | 2/1993 | Ota et al. | 365/201 |
| 5,198,758 | 3/1993 | Iknaian et al. | 324/73.1 |
| 5,199,034 | 3/1993 | Yeo et al. | 371/21.1 |
| 5,265,054 | 11/1993 | McClure | |
| 5,265,100 | 11/1993 | McClure | |
| 5,285,419 | 2/1994 | Iyengar | |
| 5,289,475 | 2/1994 | Slemmer | |
| 5,295,102 | 3/1994 | McClure | |
| 5,300,840 | 4/1994 | Drouot | |
| 5,341,382 | 8/1994 | Levitt | 371/22.1 |

(List continued on next page.)

OTHER PUBLICATIONS

TCXO's Temperature Compensated Crystal Oscillators, Wenzel Associates.
Low Voltage FM XTAL Controlled Front–End, SGS–Thomson Microelectronics, Aug. 1992.
Regulating Pulse Width Modulators, SGS–Thomson Microelectronics, Dec. 1995.
Testing Systems on a Chip, R. Chandramouli and Stephen Pateras, Nov. 1996.
Boca Research Ships 56K Modems, Aaron Ricadela, Computer Retail Week, 1996.
Texas Instruments, IEEE 1149.1 Applications, Sep. 28, 1996.

*Primary Examiner*—Vu A. Le
*Attorney, Agent, or Firm*—Theodore E. Galanthay; Lisa K. Jorgenson; Christopher F. Regan

[57] ABSTRACT

An integrated circuit having enhanced testing capabilities and a method of testing an integrated circuit are provided. The integrated circuit preferably includes a substrate and a memory block on the substrate. The memory block preferably has a plurality of memory cells arranged in a plurality of rows and a plurality of columns within a defined area on the substrate, at least one bit line connected to each of the plurality of memory cells and defining a column, at least one word line connected to each of the plurality of memory cells and defining a row, and sense amplifying means connected to the at least one bit line for sensing a state of an addressed memory cell in at least one of the plurality of columns. The integrated circuit also includes a selectable stress tester on the substrate and connected to the memory block for selectively stress testing only portions of the memory block and not other portions so as to determine whether to accept or reject a memory block.

37 Claims, 4 Drawing Sheets

U.S. PATENT DOCUMENTS

| | | | |
|---|---|---|---|
| 5,355,340 | 10/1994 | Coker et al. . | |
| 5,381,277 | 1/1995 | Jaffard et al. . | |
| 5,392,005 | 2/1995 | Bortolini et al. | 331/44 |
| 5,396,464 | 3/1995 | Slemmer . | |
| 5,404,331 | 4/1995 | McClure . | |
| 5,407,276 | 4/1995 | Jones | 374/184 |
| 5,408,435 | 4/1995 | McClure et al. . | |
| 5,424,601 | 6/1995 | Arnolds et al. | 310/315 |
| 5,424,988 | 6/1995 | McClure et al. . | |
| 5,428,319 | 6/1995 | Marvin et al. | 331/176 |
| 5,441,011 | 8/1995 | Takahaski et al. | 117/74 |
| 5,446,954 | 9/1995 | Knecht et al. . | |
| 5,455,542 | 10/1995 | Spence et al. | 331/158 |
| 5,459,436 | 10/1995 | Pucci et al. | 331/66 |
| 5,459,733 | 10/1995 | Alapat . | |
| 5,467,358 | 11/1995 | Scarra . | |
| 5,471,428 | 11/1995 | Baroni et al. . | |
| 5,471,482 | 11/1995 | Byers et al. | 371/21.2 |
| 5,473,284 | 12/1995 | Jantti et al. | 331/10 |
| 5,473,289 | 12/1995 | Ishizaki et al. | 331/176 |
| 5,481,229 | 1/1996 | Connell et al. | 331/158 |
| 5,488,333 | 1/1996 | Vig | 331/66 |
| 5,499,600 | 3/1996 | Okuno et al. | 117/68 |
| 5,500,509 | 3/1996 | Vogt | 219/501 |
| 5,525,936 | 6/1996 | Post et al. . | |
| 5,530,408 | 6/1996 | Vig et al. | 331/69 |
| 5,533,196 | 7/1996 | Salmon | 371/21.1 |
| 5,543,761 | 8/1996 | Klughart | 331/44 |
| 5,548,252 | 8/1996 | Watanabe et al. | 331/176 |
| 5,557,968 | 9/1996 | Krempl et al. | 73/497 |
| 5,568,084 | 10/1996 | McClure et al. . | |
| 5,574,408 | 11/1996 | Zwack | 331/176 |
| 5,603,570 | 2/1997 | Shimizu | 374/100 |
| 5,604,467 | 2/1997 | Matthews | 331/176 |
| 5,604,468 | 2/1997 | Gillig | 331/176 |
| 5,607,236 | 3/1997 | Takagi et al. | 374/117 |
| 5,608,359 | 3/1997 | Knecht et al. | 331/68 |

METHOD OF STRESS TESTING INTEGRATED CIRCUIT HAVING MEMORY AND INTEGRATED CIRCUIT HAVING STRESS TESTER FOR MEMORY THEREOF

FIELD OF THE INVENTION

The present invention relates to the field of integrated circuits, and, more particularly, to an integrated circuit and method for testing memory portions of the chip.

BACKGROUND OF THE INVENTION

Integrated circuits are widely used in many electronic applications. A typical integrated circuit may include logic or processor portions along with one or more accessible memory portions on the same integrated circuit die. For example, an application specific integrated circuit ("ASIC") may include one or more random access memory ("RAM") blocks. The RAM blocks typically include arrays or memory cells arranged in rows and columns. A portion of the memory address selects one or more of the memory cells in the selected row and column for access, either for reading data or writing data to the addressed location.

Memory circuits such as RAMs are especially subject to having significant test costs not only because of the necessity of both writing data to and reading data from each of the bits in the memory, but also because RAMs are often subject to failures due to pattern sensitivity. Pattern sensitivity failures arise because the ability of a bit to retain its stored data state may depend upon the data states stored in, and the operations upon bits which are physically adjacent to a particular bit being tested. This causes the test item for RAMs to be not only linearly dependant upon its density (i.e., the number of bits available for storage) but, for some pattern sensitivity tests, dependant upon the square (or 3/2 power) of the number of bits. Accordingly, the density of RAM devices increases, generally by a factor of four from generation to generation. The time required to test each bit of each device in production increases at a rapid rate.

Since the RAM blocks may be embedded with other circuit portions, direct access to the memory blocks also can be very difficult for testing. Memory circuits are typically tested by addressing test patterns to the memory requiring multiple periods of vectors for each test cycle, and millions of test cycles are required to superficially access all bits.

A solution which has been used in the past to reduce the time and equipment required for the testing of memories, such as RAMs, is the use of special test modes, where the memory enters a special operation different from its normal operation. In such test modes, the operation of the memory can be quite different from that of normal operation, as the normal operation of internal testing can be done without being subject to the constraints of normal operation.

An example of a special test mode is an internal parallel or multi-bit test mode. Conventional parallel test modes allow access to more than one memory location in a single cycle, with common data written to and read from the multiple locations simultaneously. For memories which have multiple input/output terminals, multiple bits can be accessed in such a mode for each of the input/output terminals, in order to achieve the parallel operation. Such parallel testing is preferably done in such a way that the multiple bits accessed in each cycle are physically separated from one another so that there is little likelihood of pattern sensitivity integration among the simultaneously accessed bits. Some conventional parallel test operations may be done in different way, but these test operations often require extensive external equipment, e.g., automated test equipment, which often needs to be customized for particular operations. These parallel test operations also can continue to take extensive amounts of time to accomplish the testing results.

Another example of a parallel test operation can be seen in U.S. Pat. No. 5,265,100 by McClure et al. which describes a semiconductor memory with an improved test mode and a method of parallel testing a plurality of memory locations. This method involves selecting the plurality of memory locations, comparing the contents of the selected memory locations, and communicating the contents of a first one of the selected memory locations to an output buffer of the integrated circuit during the comparing step. The output buffer of the memory circuit is then disabled so as not to be able to present the communicated contents of the first memory locations responsive to the result of the comparing step indicating that the contents of the selected memory locations do not all match one another. This parallel test operation, however, can still take extensive amounts of time to accomplish the testing results. Because testing memory of an integrated circuit can continue to take hundreds or thousands of hours and the compaction of circuitry in the same small area continues to increase, these conventional methods and devices are becoming inadequate.

SUMMARY OF THE INVENTION

With the foregoing in mind, the present invention advantageously provides a method of stress testing an integrated circuit having memory and an integrated circuit having stress tester for memory of the integrated circuit which significantly reduces the amount of time required to test the memory. Also, the incremental density of the circuitry of an integrated circuit according to the present invention advantageously remains relatively unchanged. The integrated circuit and method of the present invention, for example, advantageously reduces what can be a lengthy 2–3 month AC stress testing of memory, e.g., RAM, on an integrated circuit to only a few days. This reduction advantageously saves time and resources for the manufacturer. The shortening of the AC qualification testing further allows manufacturers to ship product much more quickly to customers.

More particularly, the present invention provides an integrated circuit having enhanced testing capabilities. The integrated circuit preferably has a substrate and a memory block on the substrate. The memory block preferably includes a plurality of rows and a plurality of columns within a defined area on the substrate. At least one bit line is connected to each of the plurality of memory cells and defines a column. At least one word line also is connected to each of the plurality of memory cells and defines a row. Sense amplifying means is connected to the at least one bit line for sensing a state of an addressed memory cell in at least one of the plurality of columns. Selectable stress testing means is formed on the substrate and is connected to the memory block for selectively stress testing only selected portions of the memory block and not others so as to determine whether to accept or reject a memory block.

The present invention also includes methods of testing an integrated circuit having a block of memory formed thereon. A method preferably includes generating a high frequency waveform signal and generating a test pattern across boundaries between only two columns and only two rows of the memory block, i.e., preferably adjacent columns and adjacent rows, responsive to the high frequency waveform signal so as to determine whether to accept or reject the memory block.

Another method of testing an integrated circuit having a block of memory formed thereon according to the present invention preferably includes selecting only portions, e.g., only two adjacent rows and only two adjacent columns, of the memory block for testing and not other portions and generating a stress-test pattern across only the selected portions of the memory block and not other portions so as to determine whether to accept or reject the memory block.

BRIEF DESCRIPTION OF THE DRAWINGS

Some of the features, advantages, and benefits of the present invention having been stated, others will become apparent as the description proceeds when taken in conjunction with the accompanying drawings in which.

DETAILED DESCRIPTION OF A PREFERRED EMBODIMENT

The present invention will now be described more fully hereinafter with reference to the accompanying drawings which illustrate a preferred embodiment of the invention. This invention may, however, be embodied in many different forms and should not be construed as limited to the illustrated embodiment set forth herein. Rather, this illustrated embodiment is provided so that this disclosure will be thorough and complete, and will fully convey the scope of the invention to those skilled in the art.

Figure 1:
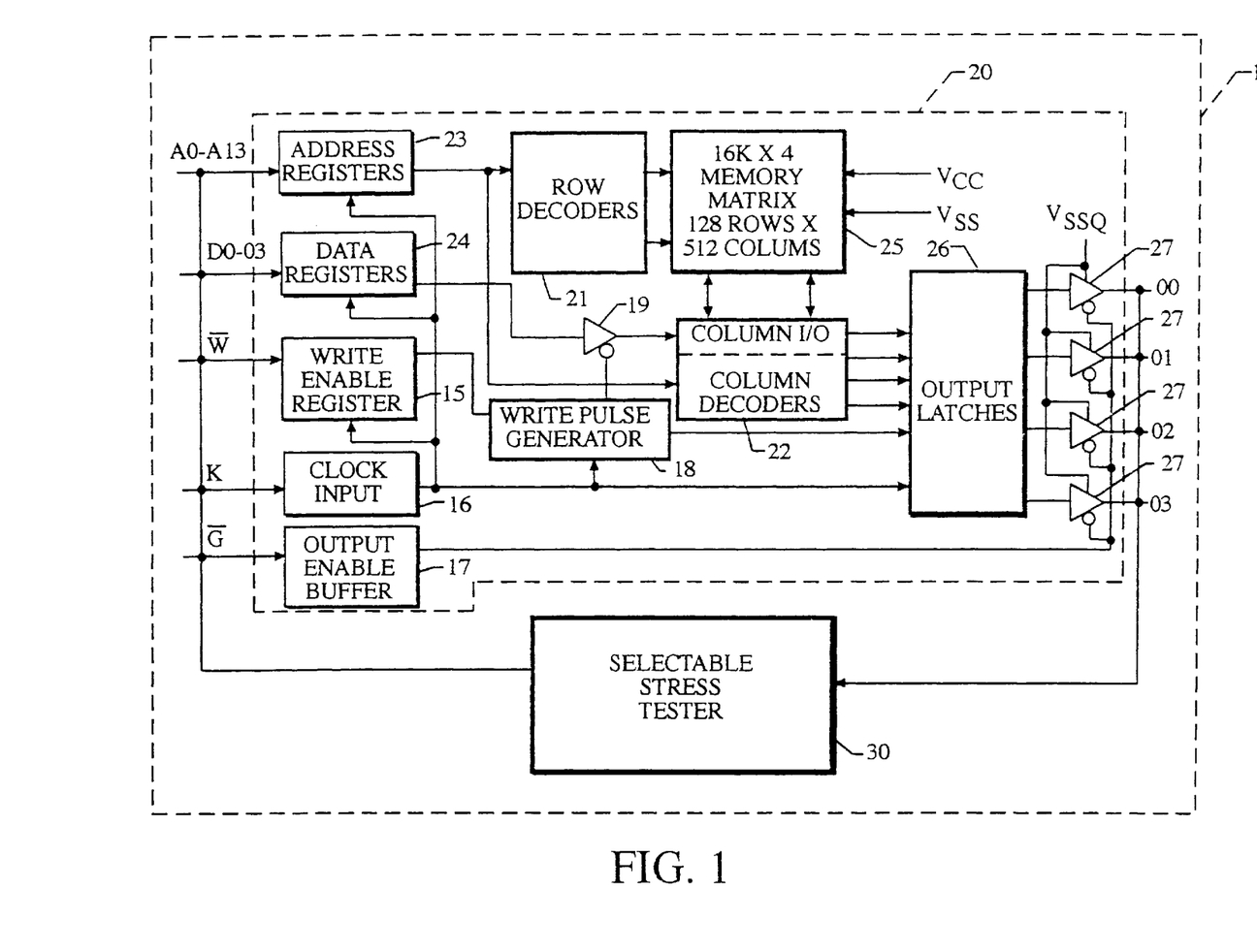
FIG. 1 is block diagram of an integrated circuit having enhanced testing capabilities according to the present invention.
Figure 2:
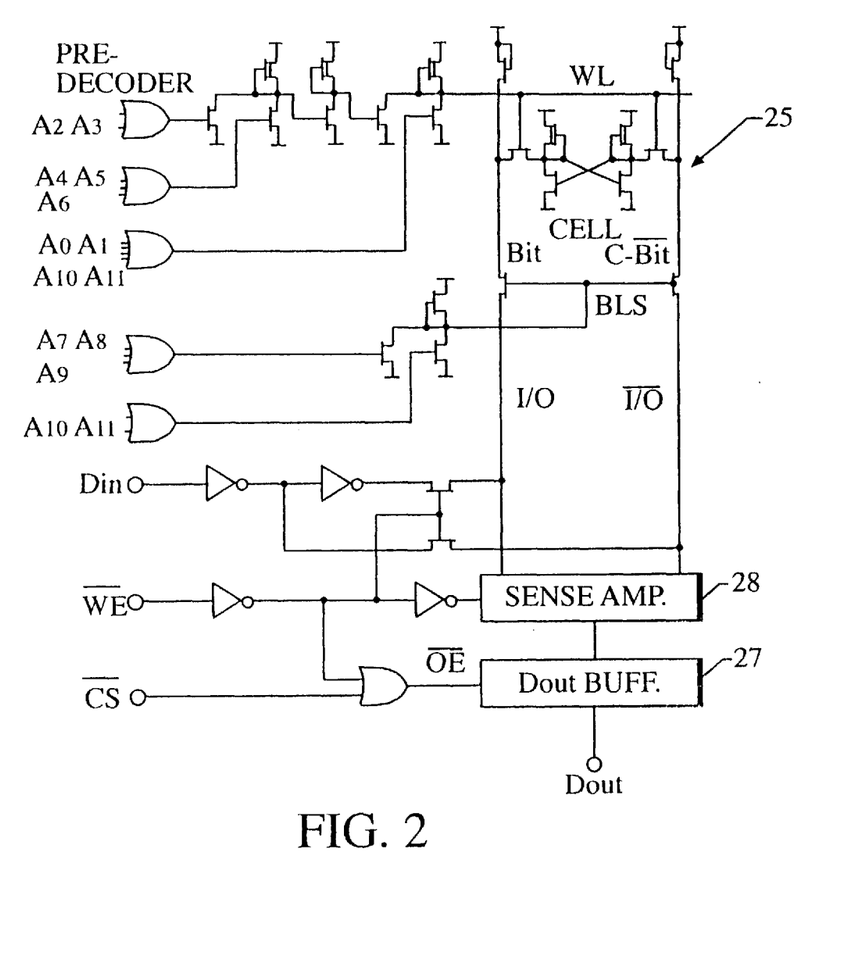
FIG. 2. is a schematic diagram of a portion of a memory block of an integrated circuit having enhanced testing capabilities according to the present invention.
Figure 3:
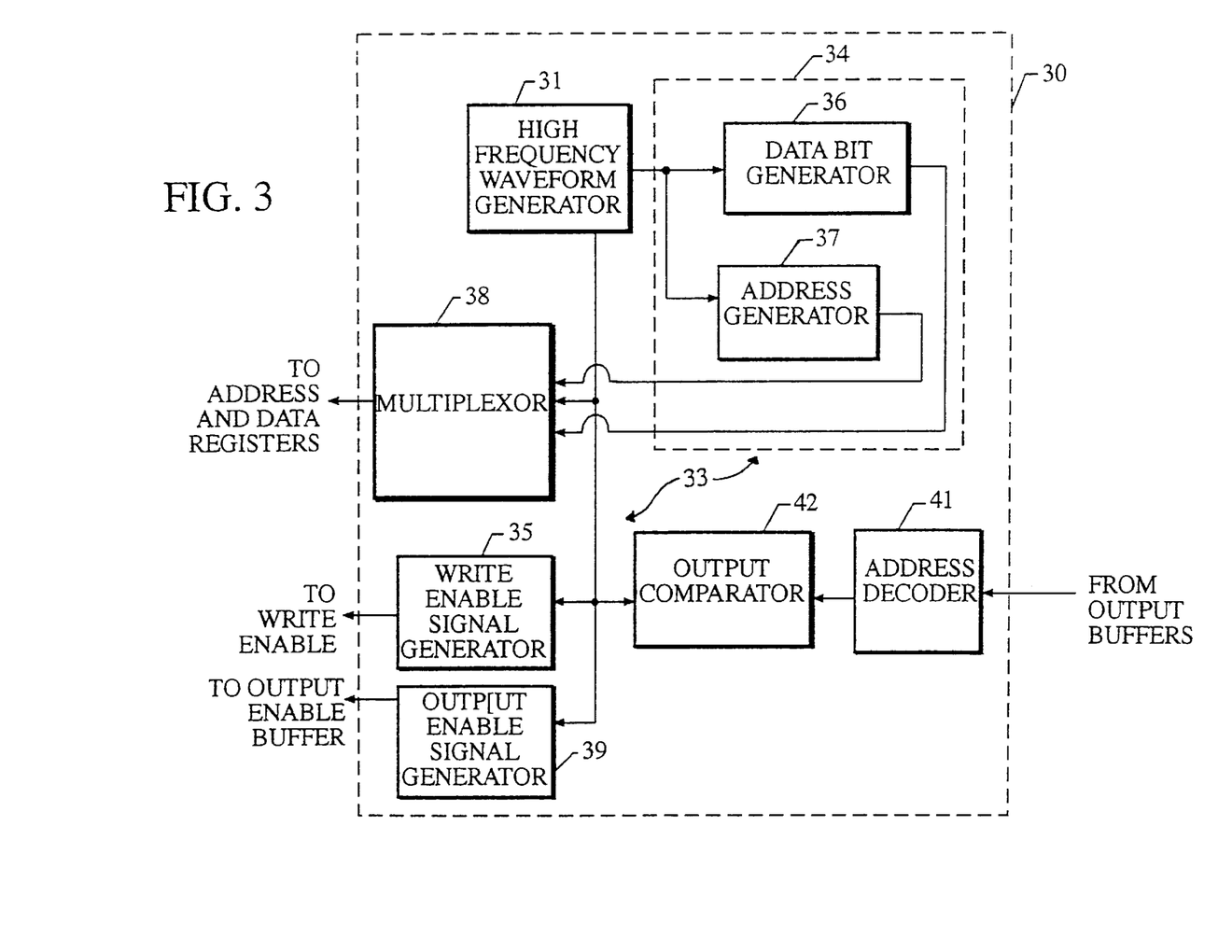
FIG. 3 is a schematic block diagram of a selectable stress tester of an integrated circuit having enhanced testing capabilities according to the present invention.

Initially, FIGS. 1–3 illustrate an integrated circuit 10 having enhanced testing capabilities according to the present invention. The integrated circuit 10 preferably has a substrate 11 and a memory block 20 on the substrate. The memory block preferably includes a plurality of memory cells 25 arranged in a plurality of rows R and a plurality of columns C within a defined area on the substrate 11. The memory block 20 preferably is a random access memory ("RAM") and, more specifically, is illustrated and described as a synchronous static random access memory ("SRAM") or self-timed RAM ("STRAM"). It will be understood by those skilled in the art, however, that the present invention can also be applicable to other types of memory blocks including DRAM, ROM, PROM, EPROM, and Flash memory blocks.

Because the memory block 20 is preferably SRAM, and preferably metal-oxide-semiconductor ("MOS") SRAM, e.g., CMOS, NMOS, or PMOS, the memory cells 25 of the memory block 20 preferably includes at least four MOS field effect transistors and two load devices, e.g., resistors or additional transistors, as understood by those skilled in the art. The CMOS SRAM process is also advantageously compatible with standard logic processes. Thus, SRAMs are relatively easy to add logic to for a variety of applications, including application specific integrated circuits ("ASICs") and SRAM arrays embedded in logic. It will be understood by those skilled in the art that the present invention is also applicable to other processes, e.g., bipolar or BiCMOS, of forming the memory as well and can be included with or added to existing designs for various memory circuits such as illustrated in FIG. 1.

As illustrated in FIG. 2, for example, at least one bit line BIT is connected to each of the plurality of memory cells 25 and defines a column C. Each memory cell 25, however, preferably has one bit line BIT and one complementary bit line C-BIT, e.g., a bit line pair. At least one word line WORD also is connected to each of the plurality of memory cells 25 and defines a row R. As understood by those skilled in the art, FIG. 2 also illustrates some of the transistor and gate circuitry for addressing and driving the bit and word lines during input and output operations and the structure of a memory cell 25.

Sense amplifying means, e.g., preferably provided by a sense amplifier 28, is connected to the at least one bit line BIT for sensing a state of an addressed memory cell 25 in the at least one column C (see FIG. 2). The sense amplifier 28 is preferably a differential sense amplifier. As understood by those skilled in the art, however, the sense amplifier 28 of the integrated circuit 10 of the present invention can also be a simple invertor, a cross-coupled amplifier, a current-mirror amplifier, or other type of sense amplifier. Desirable qualities of the sense amplifier 28, for example, are high speed, high packing density, ability to fit in the pitch of the bit lines, wide timing margin, high stability, and data holding ease.

The memory block 20 of the integrated circuit 10 also preferably includes addressing means connected to the rows R and columns C of the memory cells 25 for selectively addressing each of the plurality of memory cells 25. As understood by those skilled in the art, the addressing means is preferably provided by an address register 23, a row decoder 21 responsive to the address register 23, a data register 24, a data input buffer 19 responsive to the data register 24, and a column decoder 22 responsive to the data input buffer 19. The data register 24 and the data input buffer 19 preferably form the data input means of the memory block 20. A write pulse generator 18 is also connected to the data input buffer 19 to selectively allow data to be written to the memory cells 25. The write pulse generator 18 is preferably connected to a write enable register 15 which selectively activates the write pulse generator 18.

Additionally, data output means are preferably provided for outputting data from the memory block 20. The data output means preferably includes output latches 26 connected to the sense amplifiers 28 for selectively latching data therefrom and a plurality of output buffers 27 preferably connected to the output latches 26 and to an output enable register 17 for selectively providing an output representative of the state of the memory cells 25 or data read from the memory cells 25. The address register 23, the data register 24, the write enable register 15 and the output latches 26 are preferably connected to a clock input circuit 16 for providing a clocking signal thereto. It will be understood by those skilled in the art, that the write enable register 15, the write pulse generator 18, the output enable register 17, and the clock input 16 provide control signals for the memory block 20 during standard operation. Accordingly, these elements of the memory block 20 can comprise data input and output controlling means for controlling the data input to and the data output from the memory block 20. As understood by those skilled in the art, this data input and output controlling means can also include other input and output functions, e.g., chip select, registers, buffers, or other circuitry.

As perhaps best illustrated in FIGS. 1 and 3, selectable stress testing means 30, e.g., preferably provided by a selectable stress tester, is formed on the substrate 11 of the integrated circuit 10 and is connected to the memory block 20, e.g., inputs and outputs thereof, for selectively stress testing only portions of the memory block 20 and not other portions for a concentrated predetermined period of time so as to determine to whether to accept or reject the memory block 20. The selectable stress tester 30, more particularly, on the input portion of the memory block 20 is connected to an address line of the address register 23, to a data line of the data register 24, and to the control lines, namely the write enable register 15, the clock input 16, and the output enable register 17. On the output portion of the memory block 20, the selectable stress tester 30 is preferably connected to the output buffer 27 to receive the tested output therefrom. The selectable stress tester 30 is preferably operable only in a testing mode so as to not interfere with the normal operation of the memory block 20 after it is accepted for shipment or use purposes.

Because the bit lines BIT, C-BIT, the addressing means, and the sense amplifying means are repetitive over the entire memory block 20, only selected potentially weak areas of a memory block 20 need be tested to thereby statistically predict whether to accept or reject the memory block 20 based upon the results of the test. These selected areas, for example, are preferably weak areas across boundary lines preferably between side-by-side columns and/or side-by-side rows. In other words, if the selected weak areas of the design of a memory block 20 pass a high frequency AC stress test, then it is predictable that the other stronger areas of the memory block 20 should also pass. If, on the other hand, the selected weak areas of a memory block 20 do not pass a high frequency AC stress test, then the memory block should be rejected. Because the additional circuitry required for including these test capabilities on the integrated circuit 10 is relatively small or minimal, the incremental density of the circuitry of an integrated circuit 10 according to the present invention advantageously remains relatively unchanged.

The selectable stress testing means 30 preferably includes high frequency waveform generating means 31 on the substrate 11 for generating a high frequency waveform and selectable test pattern generating means 33 on the substrate 11, responsive to the high frequency waveform generating means 31, and connected to the memory block 20 for generating a test pattern across only selected portions of said memory block and not other portions. As understood by those skilled in the art, the high frequency waveform generating means 31 is preferably provided by a ring oscillator. For example, as understood by those skilled in the art, the ring oscillator can be three logic inverters or inverting gates, e.g., preferably CMOS or NMOS, connected in a closed ring configuration. The number of inverters or inverting gates of the ring oscillator can also be five, seven, or some other preferably odd number depending on the specific application and desired performance criteria of the ring oscillator 32.

The high frequency waveform preferably is a waveform having a frequency significantly greater, e.g., as fast as about 100 MHz, than the few megahertz operating frequency of the other conventional qualification testing hardware for AC stress testing the selected portions of the memory block 20. The frequency can be selected to speed up the stress cycle on the memory block 20 while keeping in mind that the concentration of the stress test on only portions of the memory block 20 and not other portions will also further improve the inadequate conventional 2000 hour, e.g., about 3 months, operating life stress test. It therefore will be understood by those skilled in the art that the waveform generating means 31 can have a frequency greater than the operating frequency of conventional qualification testing hardware circuitry and yet accomplish these goals of significantly decreasing the testing time period.

The test pattern generating means 33 selectively generates the test pattern across boundaries between only two adjacent rows R and only two adjacent columns C of the memory block 20. The test pattern generating means 33 preferably includes address bit generating means 37 for generating at least one address bit, data bit generating means 36 for generating at least one data bit, write enable generating means 35 for generating a write enable signal, and selecting means 34 for selecting a predetermined address of only two columns C and only two rows R. The selecting means preferably includes multiplexing means 38 for multiplexing the generated address bits and the generated data bits with the addressing means, e.g., address register and data register, of the memory block 20 for application to only two side-by-side words and two side-by-side bits and output enable signal generating means 39 for generating at least one output enable signal, e.g., chip select ("CS"), for enabling the selected portions of the memory block 20.

The selectable stress testing means 30 further includes address decoding means 41 responsive to the output buffer 27 of the memory block 20 for decoding a selected address from the output buffer 27. Output data comparing means 42 is preferably responsive to the address decoding means for comparing the address decoded data with expected results. The comparing means 42, for example, can be a chip register, a signature comparator, clock cycle shifting circuit, or other means known to those skilled in the art for comparing the output data.

As illustrated in FIGS. 1–4, the present invention also includes methods of testing an integrated circuit 10 having a block of memory 29 formed thereon. A method preferably includes generating a high frequency waveform signal and generating a test pattern across boundaries between only two rows R and two columns C of the memory block 20, i.e., preferably adjacent rows R and adjacent columns C, responsive to the high frequency waveform signal so as to determine whether to accept or reject the memory block 20 of the integrated circuit 10. The test pattern generating step preferably includes generating a write enable signal, generating at least one address bit, generating at least one data bit, and selecting a predetermined address of only two rows R and only two columns C of a memory block. This test pattern generating step also preferably includes generating at least one enable signal for enabling only selected portions of the memory block 20 and decoding a selected address for high frequency testing. The test pattern generating step further preferably includes multiplexing the generated address bits and the generated data bits with regular logic and applying the multiplexed address and data bits to only two side-by-side words and two side-by-side bits.

Another method of testing an integrated circuit 10 having a block of memory 20 formed thereon according to the present invention preferably includes selecting only portions, e.g., only two adjacent rows R and only two adjacent columns C, of the memory block 20 and not other portions for testing and generating a stress-test pattern across only the selected portions of the memory block 20 so as to determine to accept or reject the memory block 20. The stress-test pattern generating step preferably includes generating a write enable signal, generating at least one address bit, generating at least one data bit, and selecting a predetermined address of only two rows R and only two columns C of the memory block 20. The stress-test pattern generating step also preferably includes generating at least one enable signal for enabling only selected portions of the memory block 20 and decoding a selected address for high frequency testing. The stress-test pattern generating step further preferably includes multiplexing the generated address bits and the generated data bits with regular logic and applying the multiplexed address and data bits to only two side-by-side words and two side-by-side bits.

Figure 4:
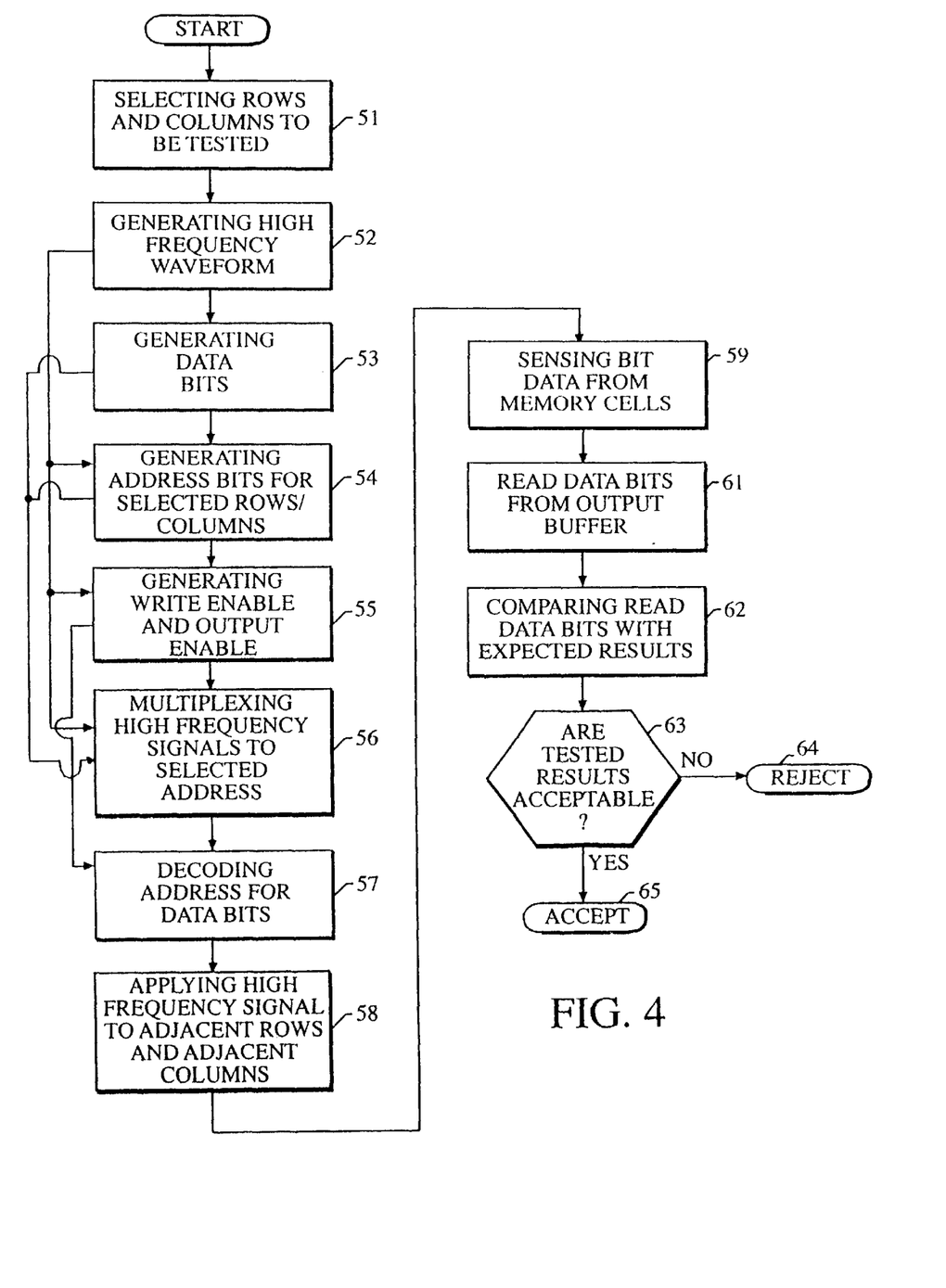
FIG. 4 is a flow diagram of a method of selectably testing memory of an integrated circuit according to the present invention.

FIG. 4 illustrates the general operation for an integrated circuit 10 as illustrated in FIGS. 1–3 and as described herein above according to the present invention. As illustrated, the rows and columns desired to be tested are selected 51 and the high frequency waveform is generated 52 by the waveform generator 31. This generated waveform can then be used as a pulse for initiating the data bit generator 36 to generate data bits 53 and the address generator 37 to generate address bits 54. This pulse can also be used to initiate the write enable and output enable signal generator 35 so as to generate a write enable signal and an output enable signal to the memory block 20.

The address and data bits and the high frequency waveform can then be multiplexed 56 by the multiplexor 38 to the address registers and data registers of the memory block. The address is then decoded for the data bits 57, and the high frequency AC data bit signals are applied to the selected rows and columns 58. The sense amplifiers of the corresponding columns sense the data bits 59, and the data is transferred to the output buffers. When the output buffer is enabled by the output enabling signal, the data is read from the output buffer 61. The read data bits are then compared to the expected results 62. If the compared results are not acceptable 63, then the memory block 20 is rejected 64. On the other hand, if the compared results are acceptable, then the memory block 20 passes the test and is accepted 65.

An integrated circuit 10 and method of the present invention also advantageously reduces the lengthy 2–3 month AC stress testing of a memory block 20, e.g., RAM, on an integrated circuit 10 to only a few days. This reduction advantageously saves time and resources for the manufacturer. The shortening of the AC qualification testing also allows a manufacturer to ship product much more quickly to customers which provides a substantial competitive and commercial advantage to the manufacturer.

In the drawings and specification, there have been disclosed a typical preferred embodiment of the invention, and although specific terms are employed, the terms are used in a descriptive sense only and not for purposes of limitation. The invention has been described in considerable detail with specific reference to this illustrated embodiment. It will be apparent, however, that various modifications and changes can be made within the spirit and scope of the invention as described in the foregoing specification and as defined in the appended claims.

That which is claimed:

1. An integrated circuit having enhanced testing capabilities, said integrated circuit comprising:
   a substrate;
   a memory block on said substrate comprising a plurality of memory cells arranged in a plurality of rows and a plurality of columns within a defined area on said substrate, at least one bit line connected to each of said plurality of memory cells and defining the column, at least one word line connected to each of the plurality of memory cells and defining the row, data input means connected to said at least one bit line for providing data input to said plurality of memory cells, sense amplifying means connected to said at least one bit line for sensing a state of an addressed memory cell in at least one of the plurality of columns, and data output means responsive to said sense amplifying means for providing data output from said memory cells; and
   selectable stress testing means on said substrate and connected to said memory block for selectively stress testing only portions of said memory block and not other portions so as to determine whether to accept or reject a memory block.

2. An integrated circuit as defined in claim 1, wherein said selectable stress testing means includes high frequency waveform generating means on said substrate for generating a high frequency waveform, and selectable test pattern generating means on said substrate, responsive to said high frequency generating means, and connected to said memory block for generating a test pattern across only selected portions of said memory block.

3. An integrated circuit as defined in claim 2, wherein said selectable stress testing means further includes address decoding means responsive to said selectable test pattern generating means for decoding a selected address for high frequency testing.

4. An integrated circuit as defined in claim 2, wherein said test pattern generating means selectively generates the test pattern across the boundaries of only two adjacent rows and only two adjacent columns of said memory block.

5. An integrated circuit as defined in claim 2, wherein said test pattern generating means comprises write enable generating means for generating a write enable signal, address bit generating means for generating at least one address bit, data bit generating means for generating at least one data bit, and selecting means for selecting a predetermined address of only two columns and only two rows.

6. An integrated circuit as defined in claim 5, wherein said selecting means includes enable signal generating means for generating at least one enable signal for enabling selected portions of said memory block.

7. An integrated circuit as defined in claim 5, wherein said selectable stress testing means further comprises multiplexing means for multiplexing the generated address bits and the generated data bits to said addressing means of said memory block so that the generated address bits and the generated data bits are applied to only two side-by-side words and two side-by-side bits.

8. An integrated circuit as defined in claim 2, wherein said high frequency waveform comprises f a waveform of at least about 100 MHz for AC stress testing selected portions of said memory block.

9. An integrated circuit as defined in claim 2, wherein said high frequency waveform generating means comprises a ring oscillator.

10. An integrated circuit having enhanced testing capabilities, said integrated circuit comprising:
    a substrate;
    a memory block on said substrate comprising a plurality of memory cells arranged in a plurality of rows and a plurality of columns within a defined area on said substrate, at least one bit line connected to each of said plurality of memory cells and defining the column, at least one word line connected to each of the plurality of memory cells and defining the row, and sense amplifying means connected to said at least one bit line for sensing a state of an addressed memory cell in at least one of the plurality of columns; and
    a selectable high frequency stress tester on said substrate and connected to said memory block for selectively stress testing across boundaries of only portions of said memory block and not other portions so as to determine whether to accept or reject a memory block.

11. An integrated circuit as defined in claim 10, wherein said selectable high frequency stress tester includes a high frequency waveform generator on said substrate for generating a high frequency waveform, and a selectable test pattern generator on said substrate, responsive to said high frequency generator, and connected to said memory block for generating a test pattern across only selected portions of said memory block.

12. An integrated circuit as defined in claim 11, wherein said selectable high frequency stress tester further includes an address decoder responsive to said selectable test pattern generator for decoding a selected address for high frequency testing.

13. An integrated circuit as defined in claim 12, wherein said test pattern generator selectively generates the test pattern across boundaries between only two adjacent rows and only two adjacent columns of said memory block.

14. An integrated circuit as defined in claim 13, wherein said test pattern generator comprises write enable generating means for generating a write enable signal, address bit generating means for generating at least one address bit, data bit generating means for generating at least one data bit, and selecting means for selecting a predetermined address of only two columns and only two rows.

15. An integrated circuit as defined in claim 14, wherein said selecting means includes enable signal generating means for generating at least one enable signal for enabling selected portions of said memory block.

16. An integrated circuit as defined in claim 15, wherein said selectable stress tester further comprises multiplexing means for multiplexing the generated address bits and the generated data bits to said addressing means of said memory block so that the generated address bits and the generated data bits are applied to only two side-by-side words and two side-by-side bits.

17. An integrated circuit as defined in claim 16, wherein said high frequency waveform comprises of a waveform of at least about 100 MHz for AC stress testing selected portions of said memory block.

18. An integrated circuit as defined in claim 17, wherein said high frequency waveform generator comprises a ring oscillator.

19. A high frequency selectable stress tester for selectively testing only portions of a memory block of an integrated circuit, the stress tester comprising:
high frequency waveform generating means for generating a high frequency waveform; and
selectable test pattern generating means responsive to said high frequency generating means and adapted to be connected to a memory block of an integrated circuit for generating a test pattern across only selected portions of the memory block and not across other portions so as to determine whether to accept or reject the memory block.

20. A stress tester as defined in claim 19, wherein said selectable stress testing means further includes address decoding means responsive to said selectable test pattern generating means for decoding a selected address for high frequency testing.

21. A stress tester as defined in claim 20, wherein said test pattern generating means selectively generates the test pattern across boundaries between only two adjacent rows and only two adjacent columns of said memory block.

22. A stress tester as defined in claim 21, wherein said test pattern generating means comprises write enable generating means for generating a write enable signal, address bit generating means for generating at least one address bit, data bit generating means for generating at least one data bit, and selecting means for selecting a predetermined address of only two columns and only two rows.

23. A stress tester as defined in claim 22, wherein said selecting means includes enable signal generating means for generating at least one enable signal for enabling selected portions of said memory block.

24. An integrated circuit as defined in claim 23, wherein said selectable stress testing means further comprises multiplexing means for multiplexing the generated address bits and the generated data bits to said addressing means of said memory block so that the generated address bits and the generated data bits are applied to only two side-by-side words and two side-by-side bits.

25. A stress tester as defined in claim 24, wherein said high frequency waveform comprises of a waveform of at least about 100 MHz for AC stress testing selected portions of said memory block.

26. A stress tester as defined in claim 25, wherein said high frequency waveform generating means comprises a ring oscillator.

27. A method of testing an integrated circuit having a block of memory formed thereon, the method comprising:
generating a high frequency waveform signal; and
generating a test pattern across boundaries between only two columns and only two rows of the memory block responsive to the high frequency waveform signal so as to determine whether to accept or reject the memory block.

28. A method as defined in claim 27, wherein the test pattern generating step includes generating a write enable signal, generating at least one address bit, generating at least one data bit, and selecting a predetermined address of only two columns and only two rows of a memory block.

29. A method as defined in claim 28, wherein the test pattern generating step further includes decoding a selected address for high frequency testing.

30. A method as defined in claim 29, wherein the selecting step includes generating at least one enable signal for enabling only selected portions of the memory block.

31. A method as defined in claim 30, wherein the test pattern generating step selectively generates the test pattern across only two adjacent rows and only two adjacent columns of the memory block.

32. A method as defined in claim 31, wherein the test pattern generating step further includes multiplexing the generated address bits and the generated data bits with regular logic and applying the multiplexed address and data bits to only two side-by-side words and two side-by-side bits.

33. A method of testing an integrated circuit having a block of memory formed thereon, the method comprising:
selecting only portions of the memory block for testing; and generating a stress-test pattern across only the selected portions of the memory block and not across other portions so as to determine whether to accept or reject the memory block, said stress-test pattern generating step including generating a write enable signal, generating at least one address bit, generating at least one data bit, and selecting a predetermined address of only two columns and only two rows of a memory block.

34. A method as defined in claim 33, wherein the stress-test pattern generating step further includes decoding a selected address for high frequency testing.

35. A method as defined in claim 33, wherein the selecting step includes generating at least one enable signal for enabling only selected portions of the memory block.

36. A method as defined in claim 33, wherein the stress-test pattern generating step selectively generates the test pattern across boundaries between only two adjacent rows and only two adjacent columns of the memory block.

37. A method as defined in claim 33, wherein the stress-test pattern generating step further includes multiplexing the generated address bits and the generated data bits with regular logic and applying the multiplexed address and data bits to only two side-by-side words and two side-by-side bits.

* * * * *